United States Patent
Riho et al.

(10) Patent No.: US 6,518,835 B2
(45) Date of Patent: Feb. 11, 2003

(54) SEMICONDUCTOR INTEGRATED CIRCUIT DEVICE HAVING AN OPTIMAL CIRCUIT LAYOUT TO ENSURE STABILIZATION OF INTERNAL SOURCE VOLTAGES WITHOUT LOWERING CIRCUIT FUNCTIONS AND/OR OPERATING PERFORMANCE

(75) Inventors: Yoshiro Riho, Ome (JP); Kiyoshi Nakai, Ome (JP); Hidekazu Egawa, Akishima (JP); Yukihide Suzuki, Akishima (JP); Isamu Fujii, Akishima (JP)

(73) Assignees: Hitachi, Ltd., Tokyo (JP); Hitachi ULSI Systems Co. Ltd., Kodaira (JP)

( * ) Notice: Subject to any disclaimer, the term of this patent is extended or adjusted under 35 U.S.C. 154(b) by 0 days.

(21) Appl. No.: 10/142,897

(22) Filed: May 13, 2002

(65) Prior Publication Data

US 2002/0130714 A1 Sep. 19, 2002

Related U.S. Application Data

(63) Continuation of application No. 09/376,470, filed on Aug. 18, 1999, now Pat. No. 6,411,160.

(30) Foreign Application Priority Data

Aug. 27, 1998 (JP) .......................................... 10-241607

(51) Int. Cl.[7] ............................................... H01L 25/00
(52) U.S. Cl. ........................................ 327/565; 327/564
(58) Field of Search ................................. 327/564–566; 326/101–103

(56) References Cited

U.S. PATENT DOCUMENTS 5,966,518 A  10/1999  Usui .......................... 327/565

*Primary Examiner*—Kenneth B. Wells
(74) *Attorney, Agent, or Firm*—Antonelli, Terry, Stout & Kraus, LLP

(57) ABSTRACT

In a semiconductor integrated circuit device which comprises a first interconnect channel including a plurality of second-layer metal interconnect layers extended in a first direction over a semiconductor chip, a second interconnect channel including a plurality of, third-layer metal interconnect layers extended in a second direction perpendicular to the first direction, an internal power supply circuit which receives a source voltage supplied from an external terminal and generates a voltage different from the source voltage, and which is provided with stabilizing capacitors, a large part of the stabilizing capacitors are formed in an area in which the second- and third-layer metal interconnect lines intersect each other.

12 Claims, 7 Drawing Sheets

LAYOUT OF DIFFUSION LAYER

LAYOUT OF INTERCONNECT LAYER

SEMICONDUCTOR INTEGRATED CIRCUIT DEVICE HAVING AN OPTIMAL CIRCUIT LAYOUT TO ENSURE STABILIZATION OF INTERNAL SOURCE VOLTAGES WITHOUT LOWERING CIRCUIT FUNCTIONS AND/OR OPERATING PERFORMANCE

This application is a continuation of U.S. application Ser. No. 09/376,470, filed Aug. 18, 1999, now U.S. Pat. No. 6,411,160, and incorporates the same herein.

BACKGROUND OF THE INVENTION

The present invention relates to a semiconductor integrated circuit device, and, more particularly, the invention relates to improvements in a power supply circuit for a dynamic RAM (random access memory), including peripheral circuits and bonding pads disposed in a central portion of a semiconductor chip, and power supply circuits for stepping down a source voltage supplied from an external terminal and for supplying stepped-down voltages to the peripheral circuits and the like.

U.S. Pat. No. 5,602,771 discloses an example of a dynamic RAM in which bonding pads and corresponding peripheral circuits are disposed in a central portion of a semiconductor chip and a source voltage supplied from an external terminal is stepped down and supplied to internal circuits including the peripheral circuits. In the dynamic RAM of U.S. Pat. No. 5,602,771, an area in which the peripheral circuits are arranged is disposed in a cross-like shape in the longitudinal and lateral central portions of the memory chip, and memory arrays are respectively disposed in four areas divided by the cross-shaped area. In addition, X- and Y-decoder address signal generating circuits, internal step-down power supply circuits and the like are disposed in the cross-shaped central portion, i.e., the central portion of the memory chip.

SUMMARY OF THE INVENTION

If the peripheral circuits are disposed in the longitudinal and lateral central portions of the memory chip in the above-described manner, interconnect channels are formed along the respective circuit arrays. Prior to the present invention, the present inventors considered a construction in which redundant circuits and the like were disposed in the central portion of a memory chip, which extended in a direction parallel to the shorter sides thereof, and an interconnect channel using a second-layer metal interconnect layer was formed as a signal path for the redundant circuits, while peripheral circuits, such as address buffers and data input/output circuits, were disposed in the central portion of the memory chip, which extends in a direction parallel to the longer sides thereof, and an interconnect channel using a third-layer metal interconnect layer was formed as a signal path for the peripheral circuits.

By adopting this construction, it is possible to realize a rational circuit layout by using a first-layer metal interconnect layer to form logic circuits and the like, which constitute constituent units of individual circuits, and by using an interconnect channel overlying the first-layer metal interconnect layer as an interconnect line which interconnects the logic circuits. However, if this construction is adopted, a portion where the two interconnect channels intersect each other is formed in the central portion of the memory chip, so that the circuits must be formed by using only the first-layer metal interconnect layer.

The first-layer metal interconnect layer uses a high-melting point metal material containing tungsten (W) so that the first-layer metal interconnect layer can be made resistant to a heating process which is employed after the layer has been formed, and so, in an interconnect line using such a first-layer metal interconnect layer, the resistance becomes comparatively large. For example, there is a case where the resistivity of the first-layer interconnect line becomes larger than the resistivity of the second-layer interconnect line. Accordingly, even if a circuit is constructed with a skillful interconnect layout by using the first-layer metal interconnect layer, it is difficult to obtain a circuit having high performance because of the comparatively large resistance of the interconnect line. For this reason, the present inventors have developed a semiconductor integrated circuit device which realizes a rational circuit layout which makes efficient use of the portion where the aforesaid two interconnect channels intersect each other.

An object of the present invention is to provide a semiconductor integrated circuit device in which a rational layout of circuit elements is realized without lowering the performance of the entire circuit. The above and other objects and novel features of the present invention will become more apparent from the following description of the present invention, taken in conjunction with the accompanying drawings.

A representative feature of the invention disclosed in the present application will be described below. In a semiconductor integrated circuit device comprising a first interconnect channel including a plurality of second layer metal interconnect layers extended in a first direction over a semiconductor chip, a second interconnect channel including a plurality of third layer metal interconnect layers extended in a second direction perpendicular to the first direction, an internal power supply circuit which receives a source voltage supplied from an external terminal and generates a voltage different from the source voltage and which is provided with stabilizing capacitors, wherein a large part of the stabilizing capacitors are occupied by capacitors formed in an area in which the second- and third-layer metal interconnect layers intersect each other.

DETAILED DESCRIPTION OF THE INVENTION

Figure 1A:
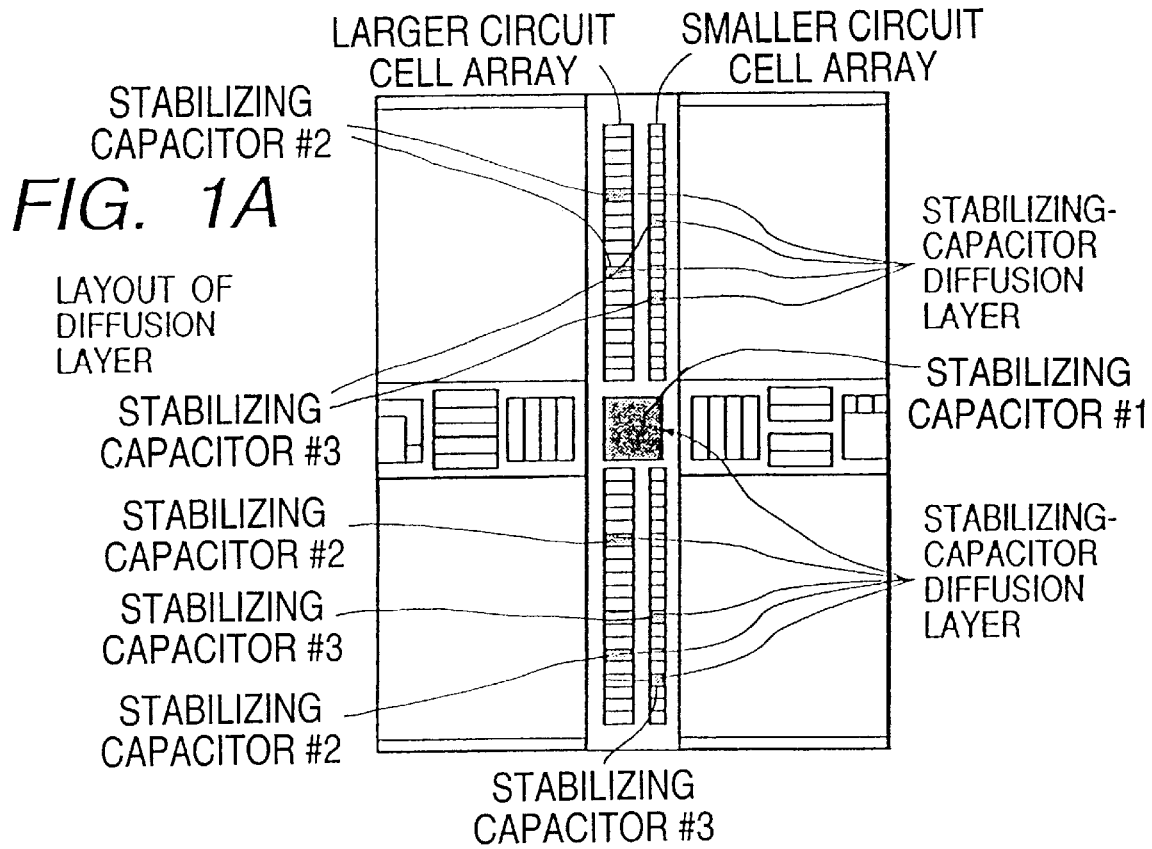
FIGS. 1A and 1B are schematic diagrams showing the construction of one embodiment of a dynamic RAM to which the present invention is applied.
Figure 1B:
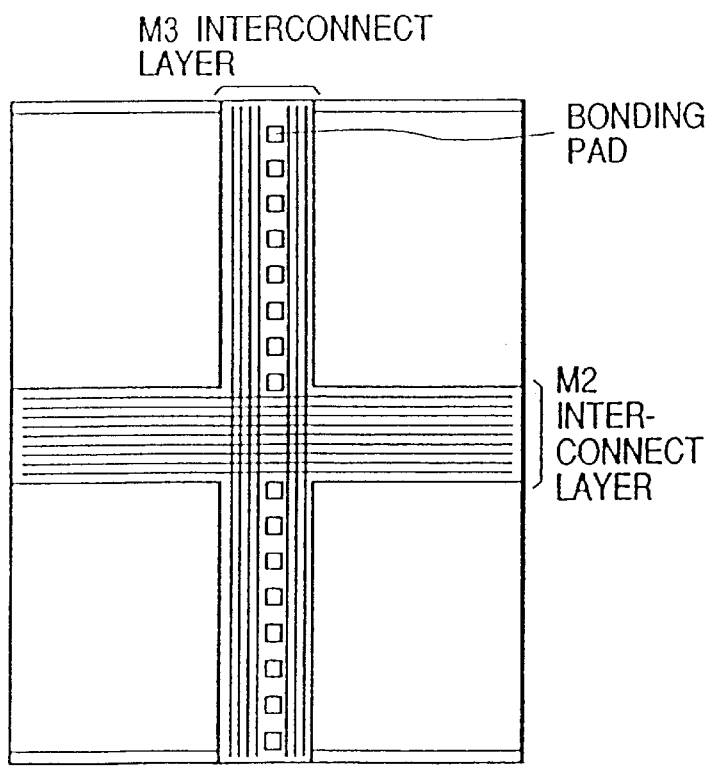

FIGS. 1A and 1B are schematic diagrams showing the construction of one embodiment of a dynamic RAM to which the present invention is applied. FIG. 1A schematically shows the layout of diffusion layers, and FIG. 1B schematically shows the layout of interconnect layers. Each of FIGS. 1A and 1B shows the layout of representative portions among circuit blocks which constitute the dynamic RAM, for the purpose of clarifying the essential portions of the circuit blocks. The representative portions are formed on a single semiconductor substrate such as a single-crystal silicon substrate by known semiconductor integrated circuit manufacturing techniques.

In this embodiment, the memory is divided into four arrays, although the present invention is not limited to a particular number. The memory is divided into right and left memory arrays with respect to the longitudinal direction of a semiconductor chip, and as shown in FIG. 1A, address input circuits and data input/output circuits are provided in a longitudinal central portion of the semiconductor chip. In addition, an array of bonding pads and an interconnect channel made of a third-layer interconnect layer M3 are provided, as shown in FIG. 1B. In the above-mentioned longitudinal central portion, circuits such as the aforesaid input/output interface circuits and power supply circuits including step-up circuits and step-down circuits are provided. In a central portion relative to the direction parallel to the shorter sides of the semiconductor chip, although the invention is not limited to a particular arrangement, redundant circuits are disposed as will be described later, and an interconnect channel made of a second-layer metal layer M2 is formed in a portion in which the redundant circuits are formed.

In the illustrated embodiment, a diffusion layer which forms a stabilizing capacitor is formed in the center of the semiconductor chip at which the third-layer interconnect channel and the second-layer interconnect channel intersect each other. This stabilizing capacitor is used as, but is not limited to, a stabilizing capacitor for the step-up power supply circuits which form operating voltages for the peripheral circuits. As will be described later, a plurality of step-up power supply circuits are distributively disposed in the portion of the longitudinal central portion of the semiconductor chip in which the peripheral circuits are formed, and stabilizing capacitors having small capacitances are also connected to the step-up power supply circuits by way of the gap-like semiconductor regions between the peripheral circuits. Since the stabilizing capacitors distributively disposed in limited gap-like semiconductor regions, the stabilizing capacitors have small capacitances as compared with the stabilizing capacitor formed in the central portion of the semiconductor chip.

The peripheral circuits, as described above, are formed on the semiconductor chip in the longitudinal central portion thereof which is made comparatively longer, and the plurality of step-down power supply circuits are distributively disposed as described above, whereby the current required by the peripheral circuits during operation can be supplied through an interconnect channel of comparatively shorter distance so that stabilization of operating voltage can be realized. A power supply line for supplying such stepped-down voltage is made from, but not limited to, the third-layer metal layer M3.

The peripheral circuits, as described above, are formed on the semiconductor chip in the longitudinal central portion thereof which is made comparatively longer. The plurality of step-down power supply circuits are distributively disposed as described above, whereby the current required by the peripheral circuits during operation can be supplied through an interconnect channel of comparatively shorter distance so that stabilization of the operating voltage can be realized. A power supply line for supplying such stepped-down voltage may be made from the third-layer metal layer M3, for example.

As described above, the four memory arrays are constituted by two right and left memory arrays with respect to the longitudinal direction of the semiconductor chip, and two top and bottom memory arrays with respect to the direction parallel to the shorter sides of the semiconductor chip. As will be described later, main row decoder areas and main word drivers are disposed in the longitudinal central portions of the memory arrays, and a so-called hierarchical word line (or divided word line) and a plurality bit lines are formed. Accordingly, each of the memory arrays is divided into a plurality of sub arrays.

Figure 2A:
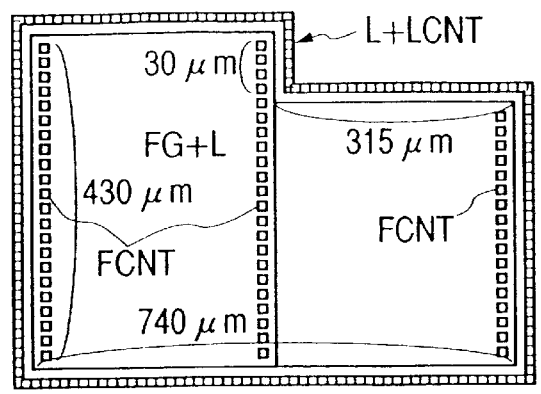
FIGS. 2A and 2B are diagrams showing the construction of a stabilizing capacitor provided in the central portion of the semiconductor chip shown in FIGS. 1A and 1B.
Figure 2B:
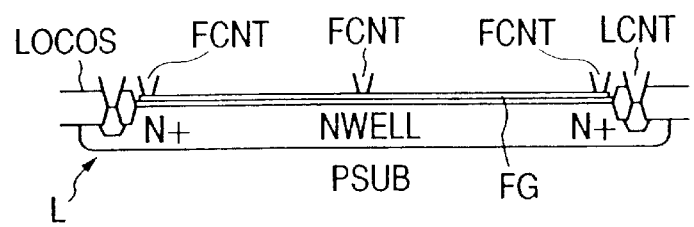

FIGS. 2A and 2B are diagrams showing the construction of the stabilizing capacitor provided in the central portion of the semiconductor chip. FIG. 2A shows the construction in plan view, while FIG. 2B shows the construction in cross-sectional view. Although the invention is not limited to a particular arrangement, an N-well region NWELL is formed in a P-substrate PSUB and is used as one electrode of a MOS capacitor, i.e., a depletion mode MOS capacitor is formed. An N+-diffusion layer L which constitutes the source and drain regions of an N-channel MOSFET is formed in the peripheral portion of this N-well region NWELL, and a contact portion LCNT is disposed in the N+-diffusion layer L as one electrode of the stabilizing capacitor, and is supplied with, for example, the ground potential of the circuit.

An insulation film is formed over the surface of the N-well region NWELL by the same process as that used in the formation of the gate insulation film of the MOSFET, and the insulation film is used as a dielectric. A conductive polysilicon layer FG is formed over the insulation film by the same process as that used to form the gate electrode of the MOSFET, and this layer is used as the other electrode of the stabilizing capacitor. Contact portions FCNT are disposed on the conductive polysilicon layer FG, and are connected to, for example, the output terminals of the step-down power supply circuits and are supplied with a stepped-down voltage VPRERI.

The stabilizing capacitor in this embodiment is formed to have a size of 430 um×425 um and a size of 400 um×315 um in relation to the peripheral circuits at the intersection of the aforesaid first and second interconnect channels, although the invention is not limited to such sizes. Since a capacitance of about 5 fF can be obtained from a size of 1 um×1 um, a stabilizing capacitor having a total size of about 730 um×400 um can have a capacitance of about 1,460 pF. In contrast, although not shown, the capacitance of each of the stabilizing capacitors appropriately distributively provided among the peripheral circuits is about 980 pF, while the capacitance of each of the stabilizing capacitors appropriately distributively provided among the output circuits is about 100 pF. In this example, the number of the stabilizing capacitors formed in the longitudinal central portion of the semiconductor chip is not less than the total number of stabilizing capacitors formed in the entire semiconductor chip.

Figure 3:
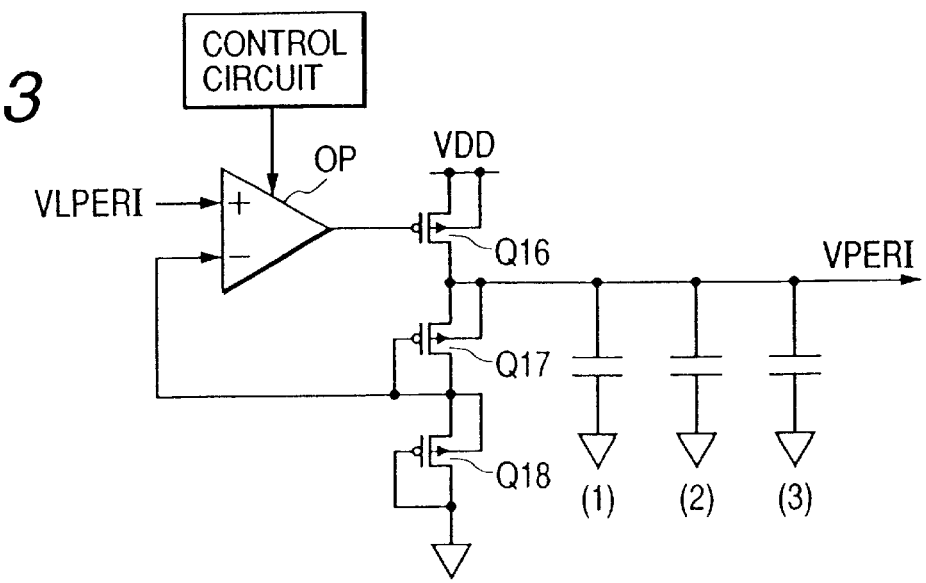
FIG. 3 is a schematic circuit diagram of one embodiment of a step-down power supply circuit according to the present invention.

FIG. 3 is a schematic circuit diagram of one embodiment of a step-down power supply circuit according to the present invention. In this embodiment, a reference voltage VLRERI is supplied to the inverting input (+) of an operational amplifier circuit OP, and the output signal is supplied to the gate of a P-channel output MOSFEFT Q16 which acts as a variable resistor. The drain of this MOSFEFT Q16 is connected to a source voltage VDD, and P-channel MOSFETs Q17 and Q18 which constitute a voltage dividing circuit are connected between the source of the MOSFEFT Q16 and the ground potential of the circuit. The divided-voltage output formed by the MOSFETs Q17 and Q18 which act as resistance elements is supplied to the inverting input (−) of the operational amplifier circuit OP. In this manner, the MOSFEFT Q16 which acts as a variable resistance element is supplied with a gate voltage in such a manner that the divided voltage and the reference voltage VLPERI coincide with each other.

The drain of the MOSFEFT Q16 serves as an output terminal and a stepped-down voltage VPERI is obtained. Connected to this output terminal are stabilizing capacitors (1), (2) and (3) for stabilizing the stepped-down voltage VPERI. As shown in FIG. 1A, the stabilizing capacitor (1) is formed in the central portion of the semiconductor chip (the intersection of the first and second interconnect channels), the stabilizing capacitor (2) is formed in the gap between the peripheral circuits, and the stabilizing capacitor (3) is formed in the gap between the output circuits.

The operational amplifier circuit OP is controlled by a control circuit. As will be described below, two kinds of operational amplifier, circuits OP are incorporated, including an operational amplifier circuit which steadily operates and an operational amplifier circuit which selectively operates when a peripheral circuit is made operative. The control circuit forms an operating signal when the peripheral circuit is made operative. A plurality of operational amplifier circuits which selectively operate are distributively disposed in the semiconductor chip.

Figure 4A:
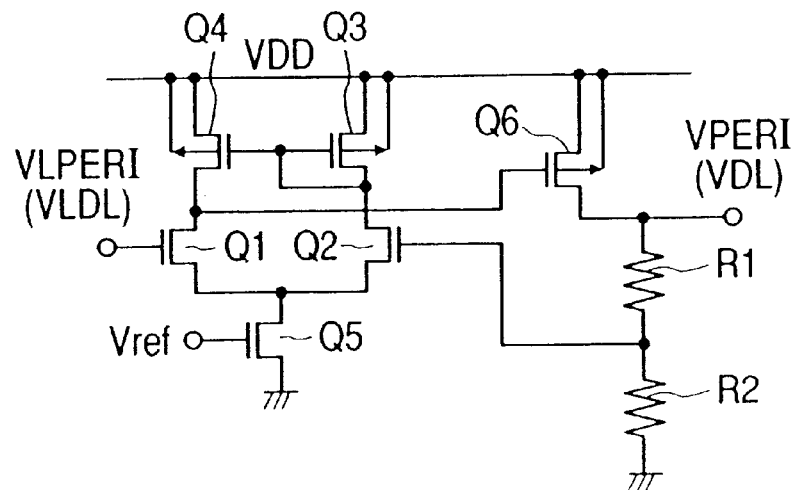
FIGS. 4A and 4B are schematic circuit diagrams showing embodiments of operational amplifier circuits which constitute the step-down power supply circuit shown in FIG. 3.
Figure 4B:
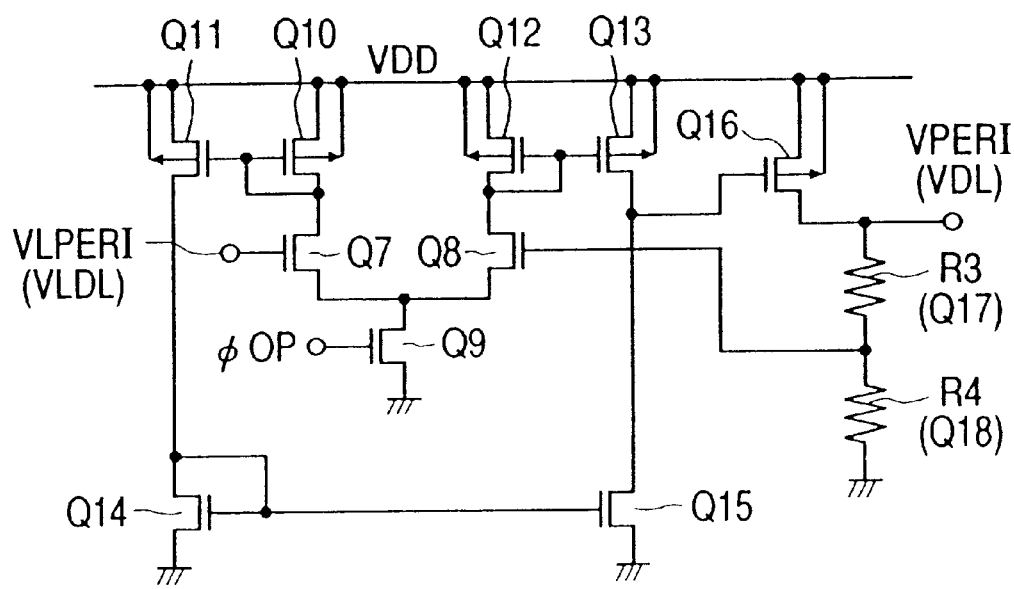

FIGS. 4A and 4B are circuit diagrams showing embodiments of operational amplifier circuits which constitute the above-described step-down power supply circuits. FIG. 4A shows an operational amplifier circuit for a standby period, while FIG. 4B shows an operational amplifier circuit for an operating period.

FIGS. 4A and 4B are circuit diagrams showing embodiments of operational amplifier circuits which constitute the above-described step-down power supply circuits. FIG. 4A shows an operational amplifier circuit for a standby period, while FIG. 4B shows an operational amplifier circuit for an operating period. The operational amplifier circuit for a standby period, as shown in FIG. 4A, needs only to have a small current supply capability to compensate for a comparatively small current, such as a leakage current, due to the stepped-down voltage VPERI at an input circuit, a peripheral circuit or the like having a CMOS construction. Accordingly, as shown in FIG. 4A, the operational amplifier circuit for a standby period includes differential MOSFETs Q1 and Q2 which are N-channel MOSFETs, an N-channel current source MOSFET Q5 whose source-drain channel is connected between a common source shared by the differential MOSFETs Q1 and Q2 and the ground potential of the circuit and which allows a constant current to flow when a reference voltage Vref is supplied to the gate of the MOSFET Q5, a differential circuit formed by P-channel MOSFETs Q3 and Q4 which are provided between the drains of the MOSFETs Q1 and Q2 and the source voltage VDD and are connected in a current-mirror form to constitute an active load circuit, a P-channel MOSFET Q6 which receives the output signal of the differential circuit, and resistors R1 and R2 which are provided between the drain of the P-channel MOSFET Q6 and the ground potential of the circuit and constitute a load circuit and a feedback circuit.

The reference voltage VLPERI is applied to the gate of the differential MOSFET Q1, and the stepped-down voltage VPERI is outputted from the drain of the output MOSFET Q6. The divided voltage formed by the resistors R1 and R2 is supplied to the gate of the differential MOSFET Q2 as a feedback voltage. In this embodiment, since the resistors R1 and R2 are formed to have an equal resistance, the output MOSFET Q6 in the operational amplifier circuit is controlled so that the reference voltage VLPERI and the feedback voltage obtained by dividing the stepped-down voltage VPERI by two are made equal to each other. Accordingly, the reference voltage VLPERI which is divided by two can be used to form the stepped-down voltage VPERI which is voltage-amplified by a factor of two. By operating the differential circuit using the constant voltage VLPERI which is one-half the output voltage VLPERI, it is possible to operate the differential circuit in its high-sensitivity region. Incidentally, the resistors R1 and R2 can also be realized with the diode connection of two MOS transistors as described above.

In the operational amplifier circuit for an operating period, as shown in FIG. 4B, in order to efficiently produce a comparatively large current which meets the requirements of an operating current of an address select circuit, such as an input circuit and an address decoder as described above, there are provided differential MOSFETs Q7 and Q8 which are N-channel MOSFETs as shown in FIG. 4B, an N-channel current source MOSFET Q9 whose source-drain channel is connected between a common source shared by the differential MOSFETs Q7 and Q8 and the ground potential of the circuit and which allows an operating current to flow during only an operating period when an operation control signal φOP is supplied to the gate of the MOSFET Q9, and P-channel MOSFETs Q10 and Q12 which are respectively disposed between the drains of the MOSFETs Q7 and Q8 and the source voltage VDD in diode form.

The drain output signals of the differential MOSFETs Q7 and Q8 are transmitted to the gate of the output MOSFET Q16 through the next output drive circuit. The drain current of the differential MOSFET Q7 is supplied to the N-channel MOSFET Q14 which is constructed in diode form, via a current-mirror circuit formed by the P-channel MOSFET Q10 and a P-channel MOSFET Q11. The source of this MOSFET Q14 is connected to the ground potential of the circuit. An N-channel MOSFET Q15 which is in current-mirror form is connected to the MOSFET Q14. The drain current of the differential MOSFET Q8 is supplied to the drain of the MOSFET Q15 via a current-mirror circuit formed by the P-channel MOSFET Q12 and the P-channel MOSFET Q13.

The drain voltage at a common drain shared by the P-channel MOSFETs Q13 and Q15 is supplied to the gate of the P-channel output MOSFEFT Q16 as a drive voltage. In this construction, the gate capacitor of the output MOSFEFT Q16 is charged or discharged by a current which corresponds to the difference between the drain currents of the differential MOSFETs Q7 and Q8, thereby forming the drive voltage. Accordingly, the drive voltage supplied to the gate of the output MOSFEFT Q16 changes from the source voltage VDD to a voltage of large signal amplitude approximately equal to the ground potential of the circuit, and the dynamic range of the drive voltage applied to the gate of the output MOSFEFT Q16 increases so that a large drive current can be formed from the output MOSFEFT Q16.

The reference voltage VLPERI is applied to the gate of the differential MOSFET Q7, while the stepped-down voltage VPERI is outputted from the drain of the output MOSFEFT Q16. A divided voltage formed by resistors R3 and R4 disposed on the side of the drain of the output MOSFEFT Q16 is supplied to the gate of the differential MOSFET Q8 as a feedback voltage. In this embodiment, since the resistors R3 and R4 are formed to have an equal resistance, the output MOSFET Q16 in the operational amplifier circuit is controlled so that the reference voltage VLPERI and the feedback voltage obtained by dividing the stepped-down voltage VPERI by two are made equal to each other. Accordingly, the reference voltage VLPERI which is divided by two can be used to form the stepped-down voltage VPERI which is voltage-amplified by a factor of two. Incidentally, the resistors R3 and R4 can also be realized with the diode connection of the two MOS transistors Q17 and Q18 as shown in FIG. 3.

As described above, since the operational amplifier circuit for an operating period drives the output MOSFEFT Q16 with the above-described large signal amplitude, the operational amplifier circuit can produce a large output current. On the other hand, a current equal to the operating current formed by the current source MOSFET Q9 which is a differential circuit flows to the output drive circuit, so that even if the currents flowing through the MOSFETs Q5 and Q9 are equal to each other, a current which is 2.5 times as large as that of the operational amplifier circuit shown in FIG. 4A flows through the operational amplifier circuit shown in FIG. 4B. Accordingly, the operational amplifier circuit shown in FIG. 4B has a substantially larger current consumption compared to the operational amplifier circuit shown in FIG. 4A. For this reason, the operational amplifier circuit shown in FIG. 4B is, as described above, intermittently or selectively operated by the control signal φOP in synchronism with the operating period of the corresponding peripheral circuit.

Figure 5:
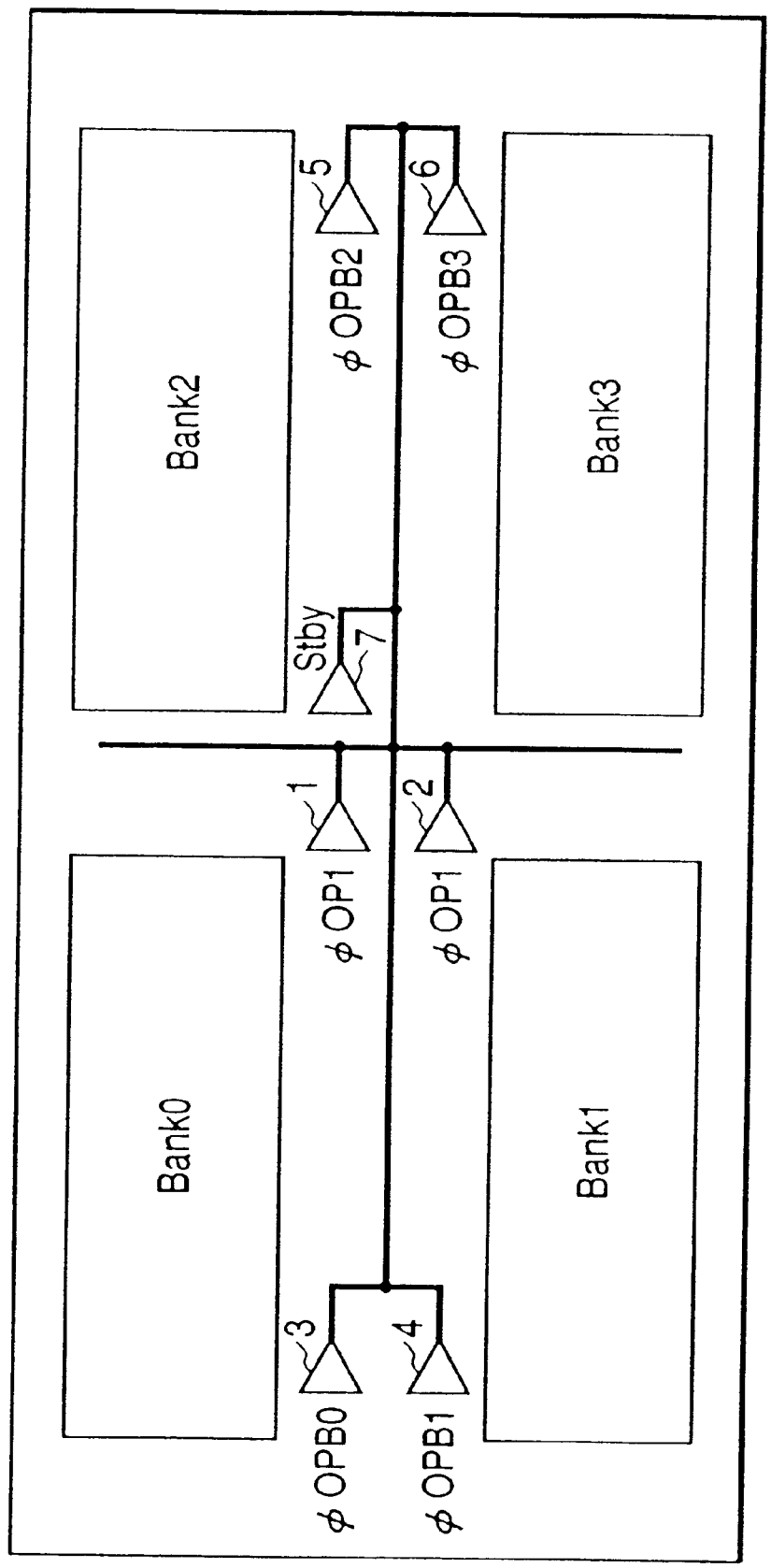
FIG. 5 is a diagram showing the overall construction of a memory chip according to one embodiment of a semiconductor memory device to which this invention is applied.

FIG. 5 schematically shows the overall construction of a memory chip according to one embodiment of a semiconductor memory device to which this invention is applied. By way of example, FIG. 5 representatively shows a plurality of step-down power supply circuits 1 to 6 which correspond to input circuits and peripheral circuits, as well as a step-down power supply circuit 7 for a standby period. One step-down power supply circuit (Stby) 7 for a standby period is disposed as described above.

In the construction in which a memory array section is divided into four memory banks (Bank0 to Bank3) as shown in FIG. 5, if, for example, one memory bank Bank0 is selected, the voltage drive circuits 1 and 2 disposed in the center and a voltage drive circuit 3 disposed at one end are made operative to supply a current in response to operation control signals φOP1 and φOPB0. In this manner, the memory bank Bank0 is supplied with current from the adjacent voltage drive circuits, whereby it is possible to minimize the voltage loss at source lines and realize stabilization of the operating voltage. During this time, the voltage drive circuits 4 to 6 provided at the other ends corresponding to the memory banks Bank1 to Bank3 are kept inoperative to decrease the current consumption.

During a refresh operation, if two memory banks, for example, the memory banks Bank0 and Bank1, are refreshed at the same time, the voltage drive circuits 1 and 2 disposed in the center and the voltage drive circuits 3 and 4 disposed at one end are made operative to supply a current in response to the operation control signals φOP1 and φOPB0, as well as an operation control signal φOPB1. During a refresh operation, if four memory banks Bank0 to Bank3 are refreshed at the same time, all voltage drive circuits 1 to 6 are made operative to supply a current in response to the operation control signals fOP1, fOPB0 and fOPB1, as well as the operation control signals fOPB2 and fOPB3. Although not shown, a plurality of step-down power supply circuits which form operating voltages VDL for sense amplifiers provided for the corresponding memory banks Bank0 to Bank3 are provided similarly to the step-down power supply circuits 1 to 6 which correspond to the above-described peripheral circuits, and are controlled in a manner similar to the above-described operations of the voltage drive circuits 1 to 6.

The step-down power supply circuits which supply the operating voltages VDL to the sense amplifiers are also formed similarly to the above-described step-down power supply circuits for the peripheral circuits shown in FIG. 4. Specifically, referring to FIGS. 4A and 4B, a reference voltage (VLDL) corresponds to the source voltage VDL for the corresponding one of the sense amplifiers, and by supplying the reference voltage VLDL, the corresponding stepped-down voltage VDL can be produced. For example, if the source voltage VDD is 3.3 V, the internal stepped-down voltage for the aforesaid peripheral circuit is 2.5 V, and the internal stepped-down voltage VDL for the aforesaid sense amplifier is 2.0 V.

Figure 6:
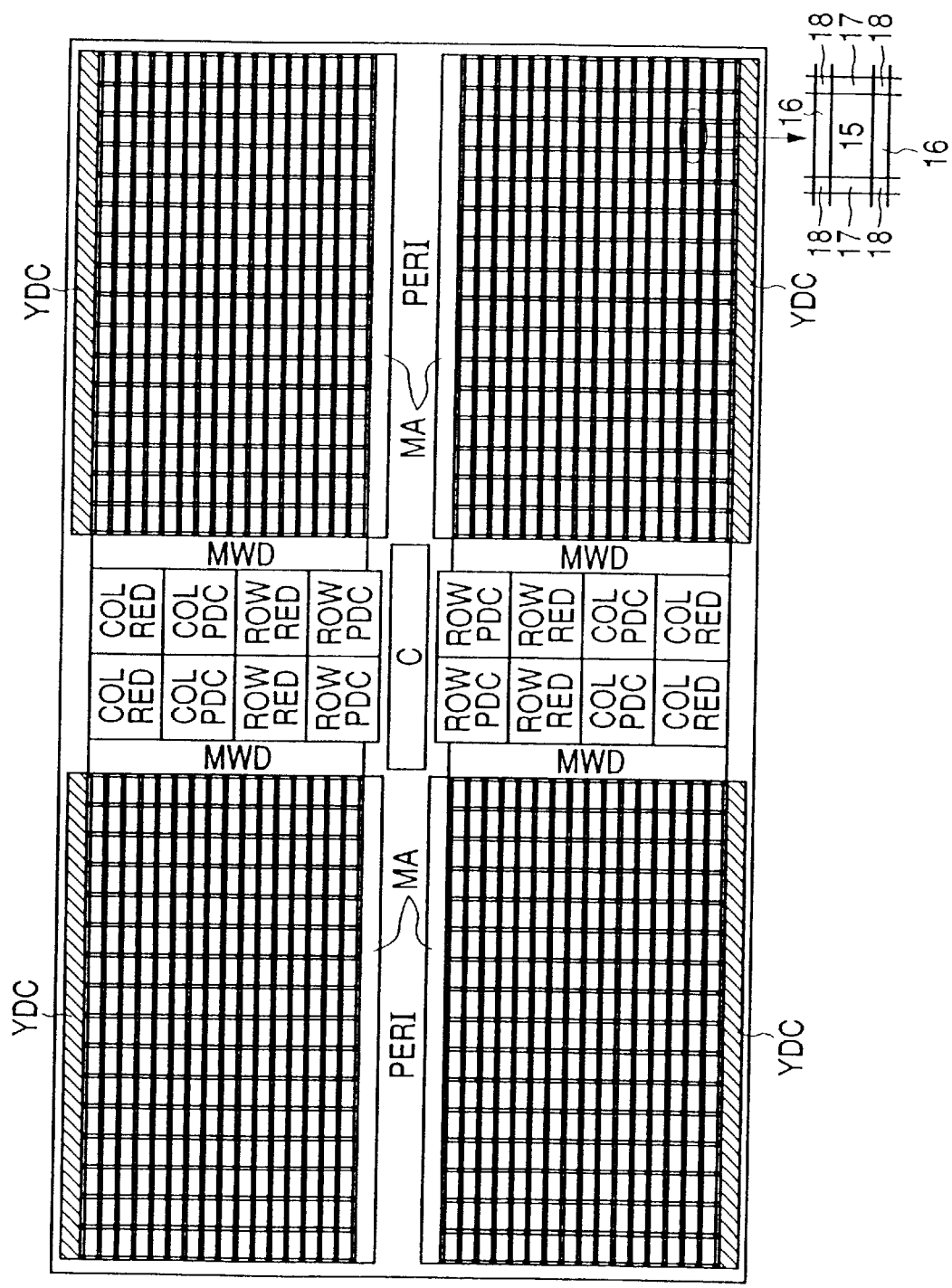
FIG. 6 is a schematic layout diagram of one embodiment of a dynamic RAM according to the present invention.

FIG. 6 is a schematic layout diagram of one embodiment of a dynamic RAM according to the present invention. In this embodiment, four memory arrays are divided in total, similar to the above-described embodiment shown in FIGS. 1A and 1B. The memory is divided into two top and bottom memory arrays and two right and left memory arrays along the longitudinal direction of a semiconductor chip, and like the above-described embodiment shown in FIGS. 1A and 1B, circuits such as input/output interface circuits PERI including address input circuits, data input/output circuits and an array of bonding pads are provided in a central portion extending in the longitudinal direction of the semiconductor chip. Main amplifiers MA are disposed on the sides of the respective memory arrays which are adjacent to the central portion.

For each of the four memory arrays, which are constituted by two top and bottom memory arrays and two right and left memory arrays along the longitudinal direction of the semiconductor chip in the above-described manner, an X-predecoder circuit ROWPDC, an X-remedy circuit ROWRED, a Y-predecoder circuit COLPDC and a Y-remedy circuit COLRED are collectively disposed in the middle portion of the semiconductor chip which is normal to the longitudinal direction. Specifically, a pair of X-predecoder circuits ROWPDC, a pair of X-remedy circuits ROWRED, a pair of Y-predecoder circuits COLPDC and a pair of Y-remedy circuits COLRED are disposed between adjacent right and left memory arrays which constitute each pair, in such a manner that one X-predecoder circuit ROWPDC, one X-remedy circuit ROWRED, one Y-predecoder circuit COLPDC and one Y-remedy circuit COLRED correspond to each of the four memory arrays.

In a similar manner, main word driver areas MWD are formed along the middle portion between the right and left memory arrays, and each of the main word driver areas is arranged to drive main word lines which are disposed to extend through the corresponding memory array between the top and bottom sides thereof. In this construction, if sub arrays similar to the above-described ones are used, the main word lines are extended through sixteen sub arrays per main word line. Y decoders YDC are provided for the respective memory arrays on the peripheral sides of the semiconductor chip opposite to the central portion. That is to say, in this embodiment, each of the four divided memory arrays is sandwiched between the corresponding one of the main amplifiers MA disposed in the central-portion side and the corresponding one of the Y decoders YDC disposed on the peripheral sides. In this case, as described above, a portion where longitudinally and horizontally extended interconnect channels intersect each other occurs in the central portion of the semiconductor chip, and a stabilizing capacitor C is formed at the intersection. In addition, stabilizing capacitors of small capacitance are appropriately distributively provided in the gaps between peripheral circuits or the like in a manner similar to the above-described one.

Although the invention is not limited to a particular arrangement, the Y decoders YDC are provided for the respective memory arrays on the peripheral sides of the semiconductor chip opposite to the central portion. In this embodiment, each of the four divided memory arrays is sandwiched between a corresponding one of the main amplifiers MA disposed in the central-portion and a corresponding one of the Y decoders YDC disposed on the peripheral sides.

Each of the memory arrays is divided into a plurality of sub arrays 15. As shown on an enlarged scale, one of the sub arrays 15 is formed by being surrounded by a pair of opposed sense amplifier areas 16 and a pair of opposed sub word driver areas 17. The intersections of the sense amplifier areas 16 and the sub word driver areas 17 constitute intersection areas 18. A sense amplifier provided in each of the sense amplifier areas 16 is constructed with a shared sense amplifier scheme. Except for the sense amplifiers disposed at both ends of the memory cell array, complementary bit lines are disposed to extend rightward and leftward of the sense amplifier and are selectively connected to the complementary bit lines of either of the right and left sub arrays 15.

Figure 7:
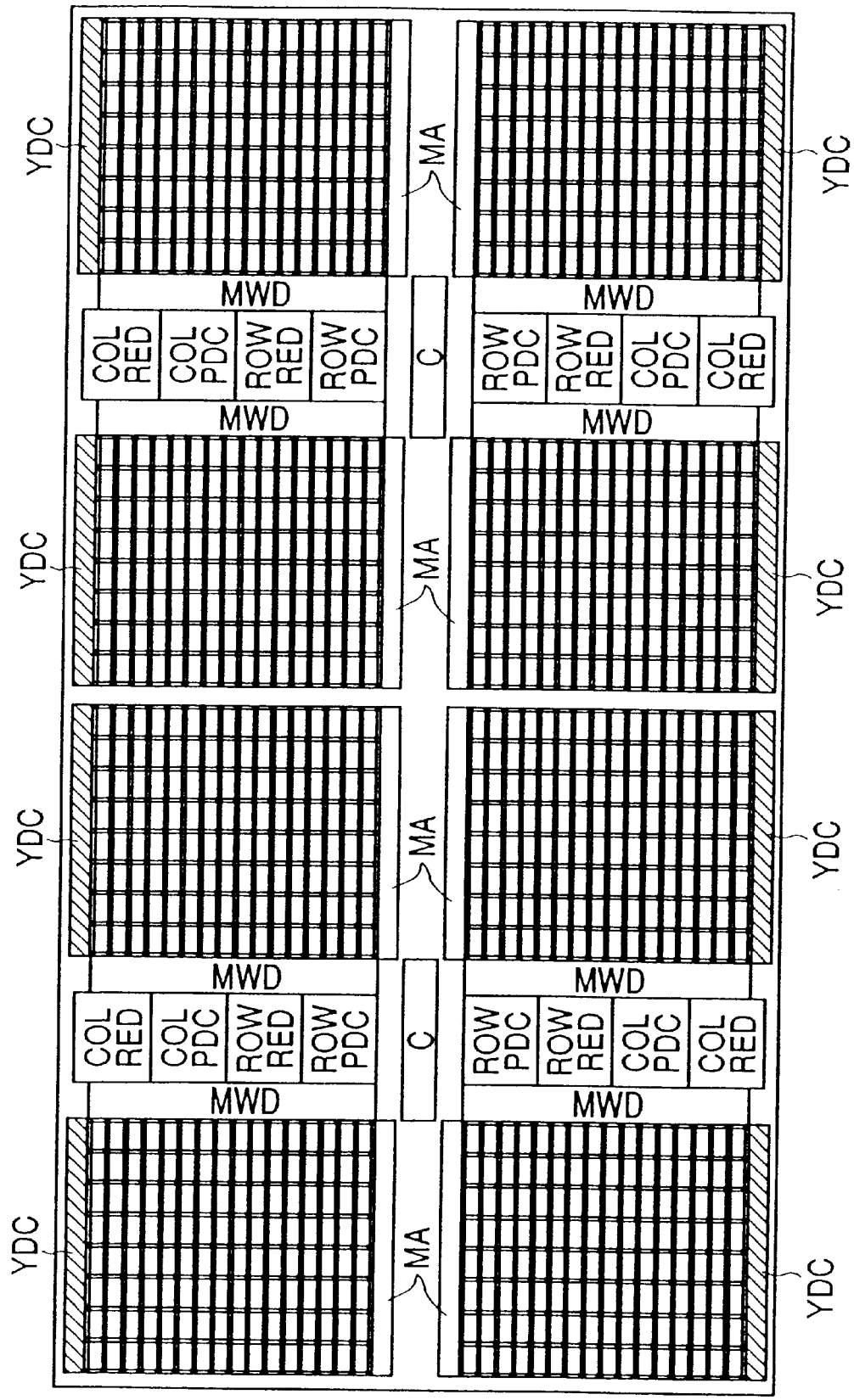
FIG. 7 is a schematic layout diagram of another embodiment of a dynamic RAM according to the present invention.

FIG. 7 is a schematic layout diagram of another embodiment of a dynamic RAM according to the present invention. In this embodiment, eight memory arrays are provided in total, but the number of memory arrays is not limited to a particular number. The memory arrays are constituted by four pairs of top and bottom memory arrays, or four pairs of right and left memory arrays, along the longitudinal direction of a semiconductor chip, and circuits such as input/output interface circuits PERI including address input circuits, data input/output circuits and an array of bonding pads are provided in a central portion extending in the longitudinal direction of the semiconductor chip. Main amplifiers MA are disposed on the sides of the respective memory arrays which are adjacent to the central portion.

For each of the eight memory arrays which are provided as four pairs of top and bottom memory arrays, or four pairs of right and left memory arrays, along the longitudinal direction of the semiconductor chip in the above-described manner, an X-predecoder circuit ROWPDC, an X-remedy circuit ROWRED, a Y-predecoder circuit COLPDC and a Y-remedy circuit COLRED are disposed in the middle portion between adjacent right and left memory arrays which constitute each pair along the longitudinal direction. Main word driver areas MWD are formed along the middle portion between the adjacent right and left memory arrays which constitute each pair, and each of the main word driver areas is arranged to drive main word lines which are disposed to extend through the corresponding memory array between the top and bottom sides thereof.

Although the invention is not limited to a particular arrangement, Y decoders YDC are provided for the respective memory arrays on the peripheral sides of the semiconductor chip opposite to the central portion. In this embodiment, each of the eight divided memory arrays is sandwiched between a corresponding one of the main amplifiers MA disposed in the central-portion and a corresponding one of the Y decoders YDC disposed on the peripheral sides. Each of the memory arrays is divided into a plurality of sub arrays in a manner similar to that shown in FIG. 6. Each of the sub arrays is formed by being surrounded by a pair of opposed sense amplifier areas and a pair of opposed sub word driver areas. The intersections of the sense amplifier areas 16 and the sub word driver areas 17 constitute intersection areas.

As described above, the memory arrays which are provided as four top memory arrays and four bottom memory arrays along the longitudinal direction of the semiconductor chip are disposed as four pairs of right and left memory arrays. An X-predecoder circuit ROWPDC, an X-remedy circuit ROWRED, a Y-predecoder circuit COLPDC and a Y-remedy circuit COLRED are disposed in the middle portion between adjacent right and left memory arrays which constitute each pair along the longitudinal direction in the above-described manner. In other words, the adjacent memory arrays are disposed above and below the X-predecoder circuit ROWPDC, the X-remedy circuit ROWRED, the Y-predecoder circuit COLPDC and the Y-remedy circuit COLRED. Each of main word drivers MWD form select signals for main word lines which are extended through the corresponding one of the memory arrays in the longitudinal direction of the semiconductor chip. Subword selecting drivers are provided together with the main word drivers MWD, and extend in parallel with the main word lines to provide select signals for sub word select lines.

Although not shown, one sub array is composed of 265 sub word lines and 256 pairs of complementary bit lines (or data lines) which cross at right angles to the sub word lines. Incidentally, spare word lines and spare complementary bit lines are provided as a replacement for defective word lines or defective bit lines. In each of the memory arrays, eight sub arrays are provided in the extending direction of one word line so that about 2k sub word lines are provided in total, whereas sixteen sub arrays are provided in the extending direction of one bit line so that about 4k of complementary bit lines are provided in total. Since a total of eight such memory arrays are provided, the semiconductor chip has a memory capacity of 8×2k×4K=64M bits in total. In this construction, each of the complementary bit lines is divided into sixteen segments along the length thereof according to the above-described sixteen sub arrays, and each of the sub word lines is divided into eight segments along the length thereof according to the above-described eight sub arrays.

Sub word drivers (sub word line driving circuits) are provided for the respective sub arrays provided in each of the memory arrays. Each of the sub word drivers is divided by a length which is one-eighth the length of each main word line, and forms a select signal for a sub word line which extends in parallel with the sub word drivers. In this embodiment, to decrease the number of main word lines, i.e., to moderate the line pitch of the main word lines, four sub word lines per main word line are disposed in the direction of the complementary bit lines, but the number of sub word lines per main word line is not limited to a particular number. Sub word select drivers (not shown) are disposed in each of the main word drivers MWD to select one sub word line from four sub word lines, each of which is divided into eight segments in the direction of the main word lines and which are assigned to each main word line in the direction of the complementary bit lines. Each of the sub word select drivers forms a select signal for selecting one sub word line from four sub word select lines extended in the direction of arrangement of the sub word drivers. This construction is similarly applied to the above-described embodiment shown in FIG. 6.

In a case where the layout shown in FIG. 7 is adopted, if a Y address is inputted, the Y address is transmitted to the corresponding one of the Y decoders YDC disposed on the peripheral sides of the semiconductor chip, through an address buffer ADDBUP. via the corresponding remedy circuit and predecoder disposed in the middle portion between the adjacent memory arrays, and a Y select signal is formed in the Y decoder YDC. Complementary bit lines for one sub array are selected by the Y select signal, and the data is transmitted to the main amplifier MA on the central-portion side of the semiconductor chip opposite to the Y decoder YDC. The data is amplified by the main amplifier MA and is outputted through an output circuit (not shown).

In this construction, it may be considered that signals are apparently sent back and forth over the semiconductor chip and the time required to output read-out signals becomes long. However, since an address signal needs to be inputted to a predetermined remedy circuit without modification, if the remedy circuit is disposed at an arbitrary location in the center of the semiconductor chip, the output time of the corresponding predecoder is determined after a design has been made as to whether the address signal indicates a defective address. That is to say, if the predecoder and the remedy circuit are disposed away from each other, a signal delay occurring between the predecoder and the remedy circuit will cause an actual Y select operation to delay.

In this construction, it may be considered that signals are apparently sent back and forth over the semiconductor chip and the time required to output read-out signals becomes long. However, since an address signal needs to be inputted to a predetermined remedy circuit without modification, if the remedy circuit is disposed at an arbitrary location in the center of the semiconductor chip, the output time of the corresponding predecoder is determined after a design has been made as to whether the address signal indicates a defective address. That is to say, if the predecoder and the remedy circuit are disposed at a distance from each other, a signal delay occurring between the predecoder and the remedy circuit will cause an actual Y select operation to delay.

In this embodiment shown in FIG. 7, the intersections of interconnect channels corresponding to the peripheral circuits and interconnect channels corresponding to the Fr redundant circuits are distributively provided at two locations. Accordingly, two stabilizing capacitors C of the above-described type are distributively provided at two locations corresponding to the respective intersection areas. Although the invention is not limited to a particular arrangement, the aforesaid circuits which steadily operate and form internal stepped-down voltages may also be provided at two locations corresponding to the distributively disposed stabilizing capacitors C. Otherwise, such a circuit may be disposed at one location in the central portion between the two stabilizing capacitors.

Figure 8:
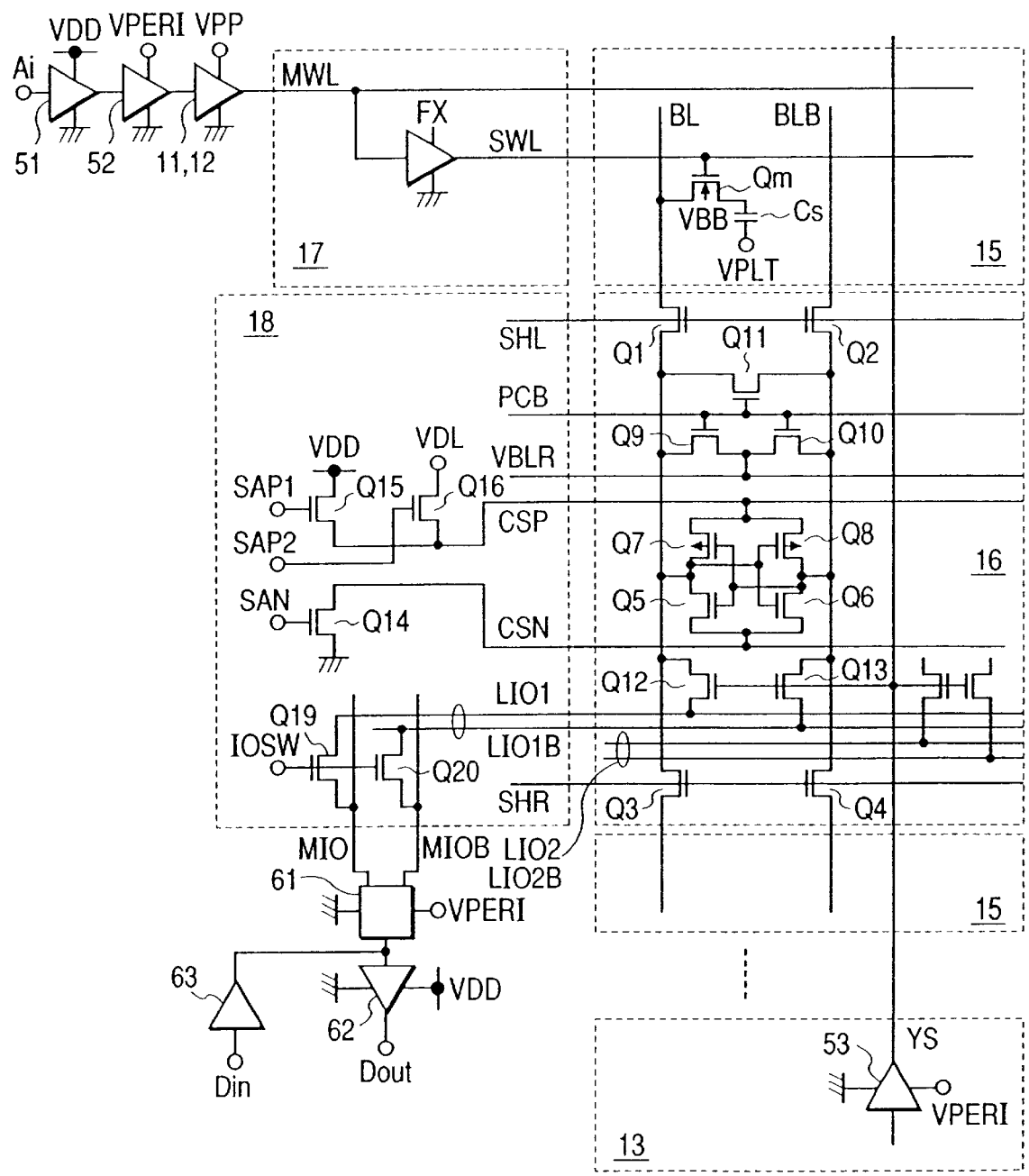
FIG. 8 is a schematic circuit diagram of one embodiment, showing a sense amplifier section of a dynamic RAM according to the present invention as well as associated circuits from address input to data output in simplified form.

FIG. 8 is a circuit diagram of one embodiment, showing a sense amplifier section of a dynamic RAM according to the present invention as well as associated circuits from address input to data output in simplified form. In FIG. 8, there are illustratively shown circuits which are provided in a sense amplifier 16 and a cross area 18 sandwiched between two top and bottom sub arrays 15, and the other circuits are shown in block form. Although reference characters attached to the respective MOSFETs are identical to those used in FIGS. 4A and 4B, it is to be understood that the MOSFETs shown in FIG. 8 have circuit functions different from those shown in FIGS. 4A and 4B.

By way of example, FIG. 8 representatively shows one dynamic memory cell which is provided between a sub word line SWL provided for one of the sub arrays 15 and one bit line BL of complementary bit lines BL and BLB. The dynamic memory cell is made of an address select MOSFET Qm and a storage capacitor Cs. The gate of the address select MOSFET Qm is connected to the sub word line SWL. The drain of the address select MOSFET Qm is connected to the bit line BL, and the storage capacitor Cs is connected to the source of the address select MOSFET Qm. The other electrode of the storage capacitor Cs is connected in common and is given a plate voltage VPLT. A negative back-bias voltage VBB is applied to the substrate (channel) of the address select MOSFET Qm. The back-bias voltage VBB is set to, but is not limited to, a voltage such as −1 V. The selection level of the sub word line SWL is a high voltage VPP which is higher than the high level of the bit line BL by the threshold voltage of the address select MOSFET Qm.

If the sense amplifier is arranged to operate at the internal stepped-down voltage VDL, the high level amplified by the sense amplifier and given to the bit line BL is set to the level of the internal stepped-down voltage VDL. Accordingly, the high voltage VPP corresponding to the selection level of the sub word line SWL is set to VDL+Vth+α. One pair of complementary bit lines BL and BLB disposed on the left side of the sense amplifier are disposed in parallel as shown in FIG. 8. The complementary bit lines BL and BLB are connected to an input/output node of a unit circuit of the sense amplifier by shared switch MOSFETs Q1 and Q2.

The unit circuit of the sense amplifier is formed by a CMOS latch circuit made of N-channel amplifier MOSFETs Q5 and Q6 and P-channel amplifier MOSFETs Q7 and Q8 all of which are cross-connected at their gates and drains. The sources of the N-channel amplifier MOSFETs Q5 and Q6 are connected to a common source line CSN. The sources of the P-channel amplifier MOSFETs Q7 and Q8 are connected to a common source line CSP. Power switch MOSFETs are connected to the common source lines CSN and CSP, respectively. Although the invention is not limited to a particular arrangement, an operating voltage corresponding to ground potential is applied to the common source line CSN to which the sources of the N-channel amplifier MOSFETs Q5 and Q6 are connected, by an N-channel power switch MOSFET Q14 disposed in the cross area 18.

Although the invention is not limited to a particular arrangement, an overdriving N-channel power MOSFET Q16 which is provided in the cross area 18 and an N-channel power MOSFET Q15 which supplies the internal voltage VDL are connected to the common source line, CSP to which the sources of the P-channel amplifier MOSFETs Q7 and Q8 are connected. A source voltage VDD supplied from an external terminal may be used as an overdriving voltage, for example. Otherwise, to reduce the dependence of the operating speed of the sense amplifier on the source voltage VDD, a voltage, which is obtained from the source of an, N-channel MOSFET having a gate to which the voltage VPP is applied and a drain to which the source voltage VDD is supplied, may be slightly stepped down.

A sense amplifier overdriving activation signal SAP1 which is supplied to the gate of the N-channel power MOSFEFT Q16 is a signal which is in phase with an activation signal SAP1 which is supplied to the gate of the N-channel power MOSFEFT Q15, and the activation signals SAP1 and SAP2 are set to their high levels on a time-series basis. The high levels of the activation signals SAP1 and SAP2 are made equal to, for example, the level of the stepped-up voltage VPP. Specifically, since the stepped-up voltage VPP is about 3.6 V, the N-channel power MOSFETs Q15 and Q16 can be fully set to their ON states. When the MOSFEFT Q16 is turned off (the signal SAP1 is at its low level), a voltage corresponding to the internal voltage VDL can be outputted from the source of the MOSFEFT Q16 because the MOSFEFT Q15 is in its OFF state (the signal SAP2 is at its high level).

Disposed at the input/output node of the unit circuit of the sense amplifier are a precharge (equalize) circuit which is made of an equalize MOSFET Q11 for short-circuiting the complementary bit lines BL and BLB and switch MOSFETs Q9 and Q10 for supplying a half precharge voltage VBLR to the complementary bit lines BL and BLB. A precharge signal PCB is supplied to the gates of the switch MOSFETs Q9 to Q11 in common. Although not shown, an inverter circuit is disposed in the cross area 18 so that the operation of a driver circuit which forms this precharge signal PCB has fast rise and fall times. Specifically, previous to word line selection timing at the starting time of a memory access, the MOSFETs Q9 to Q11 which constitute the precharge circuit are switched at a high speed through a corresponding one of the inverter circuits distributively provided in the respective cross areas.

An IO switch circuit IOSW (the switch MOSFETs Q19 and Q20 for connecting a local IO and a main IO) is disposed in the cross area 18. In addition to the circuits shown in FIG. 3, as required, various other circuits are provided, such as a half-precharge circuit for the common source lines CSP and CSN of the sense amplifier, a half-precharge circuit for a local input/output line LIO, a VDL precharge circuit for a main input/output line, and distributed driver circuits for shared select signal lines SHR and SHL.

The unit circuit of the sense amplifier is connected to similar complementary bit lines BL and BLB of the sub array 15 shown in the lower portion of FIG. 8, via shared switch MOSFETs Q3 and Q4. For example, if the sub word line SWL for the sub array shown in the upper portion of FIG. 8 is selected, the shared switch MOSFETs Q1 and Q2 shown on the upper side of the sense amplifier are turned on, while the shared switch MOSFETs Q3 and Q4 shown on the lower side of the sense amplifier are turned off. Switch MOSFETs Q12 and Q13 constitute a column (Y) switch circuit, and if the select signal YS is set to its selection level (high level), the switch MOSFETs Q12 and Q13 are turned on to connect the input/output node of the unit circuit of the sense amplifier to local input/output lines LIO1, LIO1B, LIO2 and LIO2B and the like.

Thus, the input/output node of the unit circuit of the sense amplifier is connected to the complementary bit lines BL and BLB shown on the upper side of the sense amplifier, and the sense amplifier amplifies the small signal stored in the memory cell connected to a selected sub word line SWL and transmits the amplified signal to the local input/output lines LIO1 and LIO1B through the column switch circuit (Q12 and Q13). The local input/output lines LIO1 and LIO1B are extended along a row of sense amplifiers, i.e., laterally as viewed in FIG. 8. The local input/output lines LIO1 and LIO1B are respectively connected to main input/output lines MIO and MIOB to which the input terminal of a main amplifier 61 is connected via the IO switch circuit formed of the N-channel MOSFETs Q19 and Q20 disposed in the cross area 18. The 10 switch circuit is switch-controlled by a select signal produced by decoding an X address signal. Incidentally, the IO switch circuit may be constructed as a CMOS switch in which p-channel MOSFETs are respectively connected in parallel with the N-channel MOSFETs Q19 and Q20.

In the construction in which selection from two pairs of complementary bit lines is made by the column select signal YS as described above, the local input/output line LIO and the main input/output line MIO which are shown by two dashed lines in the embodiment of FIGS. 2A and 2B correspond to the above-described two pairs of input/output lines. In the burst mode of a synchronous DRAM, the column select signal YS is switched by a counter operation and the connections between the local input/output lines LIO1, LIO1B and LIO2, LIO2B and the two pairs of complementary bit lines BL and BLB of the sub arrays are sequentially switched.

An address signal Ai is supplied to an address buffer 51. This address buffer 51 operates in a time-division manner to fetch an X address signal and a Y address signal. The X address signal is supplied to a predecoder 52, and a select signal for a main word line MWL is formed via a main row decoder 11 and a main word driver 12. The address buffer 51, which is arranged to receive the address signal Ai supplied from an external terminal, is operated by the source voltage VDD supplied from the external terminal, and the predecoder 52 is operated by the above-described stepped-down voltage VPERI and the main word driver 12 is operated by the stepped-up voltage VPP. A logic circuit having a level conversion function for receiving a predecode signal which will be described below is used as the main word driver 12. A column decoder (driver) 53 receives the Y address signal supplied by the time-division operation of the address buffer 51 and forms the above-described column select signal YS.

The main amplifier 61 is operated by the stepped-down voltage VPERI, and the signal from the main amplifier 61 is outputted from an external terminal Dout through an output buffer 62 operated by the source voltage VDD supplied from the external terminal. A write signal inputted from an external terminal Din is inputted through an input buffer 63, and is supplied to the main input/output lines MIO and MIOB through a write amplifier (write driver) included in the main amplifier 61 shown in FIG. 8. The input section of the output buffer 62 is provided with a level conversion circuit and a logic section for outputting the output signal from the level conversion circuit in synchronism with a timing signal corresponding to a clock signal.

Although the invention is not limited to particular values, in a first mode, the source voltage VDD supplied from the external terminal is set to 3.3 V, the stepped-down voltage VPERI supplied to the internal circuits is set to 2.5 V, and the operating voltage VDL for the sense amplifier is set to 2.0 V. The select signal (stepped-up voltage) for the word lines is set to 3.6 V. The precharge voltage VBLR for the bit lines is set to 1.0 V which corresponds to VDL/2, and the plate voltage VPLT is also set to 1.0 V. The substrate voltage VBB is set to −1.0 V. The source voltage VDD supplied from the external terminal may also be set to a low voltage such as 2.5 V. In the case of this low source voltage VDD, the stepped-down voltage VPERI is set to 2.0 V and the stepped-down voltage VDL is made lower to approximately 1.8 V.

Effects and advantages-obtainable from the above-described embodiments are as follows.

(1) In a semiconductor integrated circuit device comprising a first interconnect channel made of a plurality of second-layer metal interconnect layers extended in a first direction over a semiconductor chip, a second interconnect channel made of a plurality of third-layer metal interconnect layers extended in a second direction perpendicular to the first direction, and an internal power supply circuit which receives a source voltage supplied from an external terminal and forms a voltage different from the source voltage and which is provided with stabilizing capacitors, a large part of the stabilizing capacitors are formed in a semiconductor area in which the second- and thirdlayer metal interconnect layers intersect each other, whereby it is possible to obtain a rational circuit layout while ensuring stabilization of an internal source voltage without lowering circuit functions or operating performance.

(2) The voltage different from the source voltage is a stepped-down voltage, and the stepped-down voltage is used as an operating voltage for internal circuits formed along the second interconnect channel, whereby it is possible to obtain a rational circuit layout while lowering the current consumption of the semiconductor integrated circuit device.

(3) In a central portion in the first direction of the semiconductor chip, a plurality of bonding pads are disposed in a line in the second direction, the second interconnect channel is formed along the bonding pads, peripheral circuits including address input circuits and data input/output circuits are disposed along the second interconnect channel, the first interconnect channel is formed in the first direction in a central portion in the second direction of the semiconductor chip, redundant circuits for remedy for defects are formed along the first interconnect channel, and memory arrays are respectively formed in four areas divided by the first and second interconnect channels, whereby it is possible to obtain a rational circuit layout along the flow of signals and stabilization of the operating voltages of the peripheral circuits.

(4) A first circuit and a second circuit are used as the internal power supply circuit which forms the stepped-down voltage. The first circuit includes a first differential circuit made of differential MOSFETs of a first conductivity type, a first current source which is provided at a common source shared by the differential MOSFETs and steadily supplies an operating current, and MOSFETs of a second conductivity type which are provided at the drains of the differential MOSFETs and are connected in a current-mirror form to constitute an active load circuit; an output MOSFET of the second conductivity type whose gate is supplied with an output signal of the first differential circuit; and a resistor which is provided at the drain of the output MOSFET and constitutes a load circuit, and the first circuit supplies a reference voltage, which corresponds to a first internal voltage, to one input of the first differential circuit and also supplies a negative feedback voltage, which is formed in the load circuit, to the other input of the first differential circuit so that an output voltage set to the first internal voltage is obtained from the drain of the output MOSFET. The second circuit includes a second differential circuit made of differential MOSFETs of the first conductivity type, a second current source which is provided at a common source shared by the differential MOSFETs and supplies an operating current during an operation of an internal circuit, and first and second MOSFETs of the second conductivity type which are provided at the drains of the respective differential MOSFETs in a diode form; an output drive circuit made of a third MOSFET of the second conductivity type which is connected to the first MOSFET in a current-mirror form, a fourth MOSFET of the second conductivity type which is connected to the second MOSFET in a current-mirror form, and MOSFETs of the first conductivity type which are provided at the drains of the third and fourth MOSFETs and are connected in a current-mirror form to constitute an active load circuit; an output MOSFET of the second conductivity type whose gate is supplied with an output signal of the output drive circuit; and a resistor which is provided at the drain of the output MOSFET and constitutes a load circuit, and the second circuit supplies a reference voltage which corresponds to the first internal voltage, to one input of the second differential circuit and also supplies a negative feedback voltage formed in the load circuit, to the other input of the second differential circuit so that an output voltage set to the first internal voltage is obtained from the drain of the output MOSFET. By using the first and second circuits as the internal power supply circuit, it is possible to obtain a highly efficient voltage step-down operation.

(5) The first circuit is set to supply a current which corresponds to a current for a standby period during which the internal circuit does not perform any operation, and is provided adjacent to the capacitor formed n the semiconductor area in which the second and third-layer metal interconnect layers intersect each other, while the second circuit is set to supply a current which corresponds to a current for a period during which the internal circuit performs an operation, and is provided at each of a plurality of locations which correspond to the peripheral circuits. Accordingly, it is possible to obtain a rational current supply corresponding to the operation of the semiconductor integrated circuit.

(6) Capacitors which are formed in gaps between the peripheral circuits and have capacitances smaller than that of the capacitor formed in the semiconductor area in which the second- and third-layer metal interconnect layers intersect each other are appropriately connected to the second circuit, whereby it is possible to obtain stabilization of the stepped-down voltage and a rational circuit layout.

(7) In a semiconductor integrated circuit device formed in a quadrilateral area, which includes a first area extended along a line traversing a first side of the semiconductor integrated circuit device, and a second area extended along a line traversing a second side which is a side adjacent to the first side, as well as memory arrays and peripheral circuits, the peripheral circuits are formed in the first and second areas and power source circuits for receiving an external source voltage and outputting internal source voltages are provided among the peripheral circuits, and capacitors which form not less than half of the capacitances of the stabilizing capacitors provided at the output parts of the power supply circuits are provided in an area where the first area and the second area intersect each other, whereby it is possible to obtain a rational circuit layout while ensuring stabilization of the internal source voltages without lowering circuit functions or operating performance.

(8) By forming the power supply circuits as step-down circuits for stepping down the external source voltage and outputting the internal source voltages, it is possible to obtain a lower power, consumption according to a rational circuit layer while ensuring stabilization of the internal source voltages without lowering circuit functions or operating performance.

Although the invention made by the present inventor has been specifically described above with reference to various embodiments, it goes without saying that the present invention is not limited to the above-described embodiments and various modifications can be made without departing from the scope of the present invention. For example, in the dynamic RAM shown in FIG. 6 or 7, as the constructions of the memory arrays, the sub arrays and the sub word drivers, it is possible to adopt various constructions in practice, and as the input/output interface of the dynamic RAM, it is possible to adopt various constructions such as those suited to synchronous specifications or Rambus specifications. For the word lines, a word shunt technique may be adopted instead of the above-described hierarchical word line technique.

The semiconductor integrated circuit device according to the present invention can be widely used as not only the above-described dynamic RAMs but also other semiconductor integrated circuit devices- such as static RAMs, or as various other semiconductor integrated circuit devices such as a one-chip microcomputer having intersecting interconnect channels and provided with an internal circuit which operates at an internally formed voltage. The internal voltages may be not only the above-described stepped-down voltages but also stepped-up voltages formed by circuits such as step-up circuits for the word lines of the dynamic RAM.

The effect of a representative feature of the invention as disclosed herein will be described below in brief. In a semiconductor integrated circuit device comprising a first interconnect channel made of a plurality of second-layer metal interconnect layers extending in a first direction over a semiconductor chip, a second interconnect channel made of a plurality of third-layer interconnect layers extending in a second direction perpendicular to the first direction, and an internal power supply circuit which receives, a source voltage supplied from an external terminal and forms a voltage different from the source voltage and which is provided with stabilizing capacitors, a large part of the stabilizing capacitors are formed in a semiconductor area in which the second- and third-layer metal interconnect layers intersect each other, whereby it is possible to obtain a rational circuit layout while ensuring stabilization of an internal source voltage without lowering circuit functions or operating performance.

We claim:

1. An integrated circuit device formed on a semiconductor substrate, comprising:
    a plurality of first interconnect lines extending in a first direction;
    a plurality of second interconnect lines extending in a second direction crossing said first direction;
    a step-down circuit coupled to receive an external power source voltage, via an external terminal, and to supply an internal voltage, via an output terminal; and
    capacitors coupled to said output terminal of said step-down circuit, to stabilize said internal voltage, wherein no less than half of the total capacitance of said capacitors is provided in an area where said first interconnect lines and said second interconnect lines intersect each other.

2. An integrated circuit device according to claim 1, wherein said first interconnect lines and said second interconnect lines are provided by different interconnect layers formed on the semiconductor substrate.

3. An integrated circuit device according to claim 1, wherein said step-down circuit steps down said external source voltage to supply said internal voltage.

4. An integrated circuit device according to claim 2, wherein one electrode of each capacitor is a diffusion layer provided on said semiconductor substrate, and another electrode of each capacitor is provided in a layer which corresponds to a gate electrode of a predetermined MOSFET formed on said semiconductor substrate.

5. An integrated circuit device according to claim 4, wherein one electrode of each capacitor is a diffuision layer provided on said semiconductor substrate, and another electrode of each capacitor is provided in a layer which corresponds to a gate electrode of a predetermined MOSFET formed on said semiconductor substrate.

6. An integrated circuit device formed on a semiconductor substrate, comprising:
    a plurality of first interconnect lines extending in a first direction;
    a plurality of second interconnect lines extending in a second direction crossing said first direction;
    a plurality of step-down circuits, each of which receives an external power source voltage and outputs an internal voltage;
    a common line connected to output terminals of said plurality of step-down circuits; and
    capacitors connected to said common line, wherein no less than half of the total capacitance of said capacitors is provided in an area where said first interconnect lines and said second interconnect lines intersect each other.

7. An integrated circuit device according to claim 6, wherein said first interconnect lines and said second interconnect lines are provided by different interconnect layers formed on the semiconductor substrate.

8. An integrated circuit device according to claim 6, wherein said step-down circuit steps down said external source voltage to supply said internal voltage.

9. An integrated circuit (IC) device formed in a predetermined area on a semiconductor substrate, comprising:
    a first channel extending in a first direction over the predetermined area on the semiconductor substrate;
    a second channel extending in a second direction perpendicular to said first direction over the predetermined area on the semiconductor substrate, said second channel intersecting said first channel;
    memory arrays; and
    peripheral circuits formed in at least one of said first channel and said second channel to operate said memory arrays, said peripheral circuits comprising power supply circuits arranged to supply internal source voltages, and stabilizing capacitors connected to output terminals of said power supply circuits, and provided in gaps between said peripheral circuits and at an intersection area where said first channel and said second channel intersect each other, for stabilizing the internal source voltages, wherein said stabilizing capacitors provided in gaps between said peripheral circuits exhibit a capacitance less than the capacitance of said stabilizing capacitors provided at said intersection area where said first channel and said second channel intersect each other.

10. A semiconductor integrated circuit device according to claim 9, wherein said power supply circuits are step-down circuits for stepping down an external source voltage to output said internal source voltages.

11. A semiconductor integrated circuit device according to claim 9, further comprising a plurality of bonding pads formed in at least one of said first channel and said second channel along said peripheral circuits.

12. A semiconductor integrated circuit device according to claim 9, wherein said internal source voltages are step-down voltages from said external source voltage used as an operating voltage for said peripheral circuits to operate said memory arrays.

* * * * *